US005973567A

United States Patent [19]

Heal et al.

[11] Patent Number: 5,973,567

[45] Date of Patent: Oct. 26, 1999

[54] TUNABLE IMPEDANCE MATCHING NETWORK FOR A MIC POWER AMPLIFIER MODULE

[75] Inventors: Mark D. Heal, Redondo Beach; John R. Grebliunas, Manhattan Beach; Howard T. Ozaki, Torrance; Arnold L. Berman, Los Angeles, all of Calif.

[73] Assignee: Hughes Electronics Corporation, El Segundo, Calif.

[21] Appl. No.: 08/876,758

[22] Filed: Jun. 16, 1997

[51] Int. Cl.$^6$ .................................................. H03F 3/60

[52] U.S. Cl. .......................... 330/286; 330/295; 330/277

[58] Field of Search ................................ 330/277, 286, 330/295

[56] References Cited

U.S. PATENT DOCUMENTS

| | | | |
|---|---|---|---|
| 5,162,755 | 11/1992 | Mara, Jr. et al. | 330/286 X |
| 5,357,212 | 10/1994 | Kohno | 330/286 X |
| 5,576,661 | 11/1996 | Kumagai | 330/286 X |

*Primary Examiner*—Robert Pascal
*Assistant Examiner*—Khanh Van Nguyen
*Attorney, Agent, or Firm*—Georgann S. Grunebach; M. W. Sales

[57] ABSTRACT

The output impedance matching network of a power amplifier module is improved by the addition of an intermediate set of bonding pads in close proximity to a power transistor in the power amplifier module. A tunable set of bond wires extend from the intermediate bonding pads to a transmission line that is coupled to the output of the power amplifier module. The tunable bond wires allow the inductance of the impedance matching network to be tuned and optimized.

8 Claims, 6 Drawing Sheets

TUNABLE IMPEDANCE MATCHING NETWORK FOR A MIC POWER AMPLIFIER MODULE

BACKGROUND OF THE INVENTION

1. Field of the Invention

This invention relates to an output impedance matching network for a MIC (Microwave Integrated Circuit) power amplifier module used in solid state power amplifiers (SSPAs).

2. Description of the Related Art

A MIC power amplifier module has an output impedance matching network to match the power transistor output impedance to the load impedance. For example, an FET power transistor has an output impedance of several ohms, whereas the load may have an impedance of 50 Ω. Tuning an impedance matching network is important in space applications because it cuts down power loss, thus saving money and weight.

An example is a 20 W internally matched power amplifier Fujitsu model FLM1415L-20, used in space satellite applications at 1500 MHz. FIG. 1 shows a plan view of this microwave integrated circuit MIC SSPA, with the lid removed. A microwave signal is fed through an input microstrip transmission line 10 which is coupled via a ceramic feed-through 12 into a copper package 14, which is gold plated on the inside. The input transmission line is then coupled by twelve gold bond wires 16 to a microstrip power splitter 20 printed on an alumina substrate 22. Twelve bond wires are sufficient to handle the power provided by input transmission line 10. Alumina dielectric substrate 22 is bonded to the inside of copper package 14 by gold germanium or gold tin solder.

Two pairs of gold bond wires 26,28 allow sufficient power to be carried from the power splitter 20 to capacitors 30,32, respectively. The plates of one side of these capacitors are formed by printing gold metalizations 34,36 on barium tetratitinate high dielectric ceramic substrates 38,40, respectively. These substrates are soldered with gold germanium or gold tin solder to the inside of copper package 14, which forms the other plate of the capacitors. Metalizations 34,36 also serve as bond pads. A gallium arsenide field effect transistor (GaAsFET) Q1 has two connected sections Q1*a* and Q1*b* with a common gate connected by gold lead 42. The Q1*a* and Q1*b* common gate has gold bond pads 44,46, respectively. Q1*a* and Q1*b* are soldered to the inside of copper package 14 by gold tin solder. Eight gold bond wires 48*a*–48*d* and 50*a*–50*d* connect bond pads 34,36 of capacitors 30 and 32 to gold bond pads 44,46 of the common gate of Q1*a* and Q1*b*. Bond wires 48*a*–48*d* and 50*a*–50*d* provide an inductance which, together with capacitors 30 and 32, forms a low pass filter (e.g. an input impedance matching network) to match the impedance of 50 Ω from the input transmission line to a low impedance at the gate of Q1. Bond wires 48*a*–48*d* and 50*a*–50*d* are pre-tuned to the correct inductance by a machine which establishes the correct spacing and shape of each bond wire loop.

FIGS. 2 and 3 show progressively larger views of Q1*a* and Q1*b* and the attached bond wires. In addition to having a common gate with bond pads 44,46, Q1*a* and Q1*b* also have a common drain with gold bond pads 58,60, which are connected by lead 56. The FET source terminals utilize via holes to make contact from the source terminal metalization 59,61 on the top surface of the FET to ground, which is provided by the floor of the package H.

Q1 drain bond pads 58,60 are connected by two sets of eight gold bond wires 62*a*–62*p* to an output power combiner bonding pad 64; multiple wires are used to accommodate the input signal plus the DC bias current in the drain. The 16 gold bond wires form a series inductor. Biasing for Q1 (not shown) is done externally. Output power combiner 64 is a gold transmission line that is printed on an alumina dielectric substrate 66 and has a defined capacitance. Substrate 66 is soldered to the inside of copper package 14 by gold tin or gold germanium solder.

The combination of the output power combiner 64 capacitance and the inductance of the bond wires 62*a*–62*p* forms a low pass output impedance matching network between the Q1 drain, which has a low impedance of about 2 Ω, and an output transmission line 68 which is connected to the opposite side of power combiner 64 and typically has a 50 Ω impedance.

The series inductance of bond wires 62*a*–62*p* is the most critical element of the impedance matching network, with the length, shape and proximity of the bond wires determining the series inductance. Slight changes in these parameters have a significant impact on both the device's output power and its power added efficiency (PAE), which is defined as (Power out RF—Power in RF) divided by (Power DC). Therefore, it is desirable to optimize the value of the series inductor by tailoring the size, shape and proximity of the bond wires for each internally matched power FET.

However, standard MIC assembly procedures typically preclude altering or replacing bond wires attached to the FET devices in high reliability applications, such as satellites. A key reliability concern is the integrity of the bond wires used in the FET. The reason for this is that if a technician physically moves a bond wire with a probe, the bond wire may pull the gold bond pad metalization off the FET drain substrate. The biggest problem is that a bond wire cannot be reattached to a damaged bond pad on Q1 and the power amplifier module must be scrapped.

One conventional way of dealing with the problem is to minimize the amount of physical movement of bond wires by a technician. This reduces breakage but requires that an additional stage having tunable capacitance and inductance be added to the circuit. This is undesirable because a two stage output creates losses and reduces the power added efficiency (PAE) . What would be more desirable would be to have only one stage of tuning for the output impedance matching network, and yet overcome the problem of the bond wires pulling bond pad metalization off the drain of Q1.

FIG. 4 is the electrical schematic for the SSPA of FIG. 1, showing the impedances that are involved in the output impedance matching network. The input transmission line 10 provides a signal to the input power splitter 22' shown in FIG. 1. All other electrical equivalents are indicated in a similar fashion. A pair of inductances 26' and 28' represent the inductances of bond wires 26 and 28. These are very short bond wires and have small inductances which are of little consequence in the circuit. Capacitances 30',32' correspond to capacitors 30, 32 and inductances 48'*a*–*d*,50'*a*–*d* represent the inductance of bond wires 48*a*–*d*,50*a*–*d*. As described in connection with FIG. 1, capacitances 30', 32' and inductances 48'*a*–*d*,50'*a*–*d* form an LC circuit, identified in FIG. 4 as input impedance matching network 52, to match the 50 Ω impedance of the input transmission line 10 to the low impedance of the Q1 gate.

The bond wire inductances 62'*a*–*p* are the primary components in the LC matching circuit, identified in FIG. 4 as the output impedence matching network 69, between the low (2 Ω) output impedance of the Q1 drain and the 50 Ω impedance of the output transmission line 68. Capacitance 64' of the output power combiner 64 is also included in the output impedance matching network. The output power combiner 64 utilizes eighth-wave length transmission lines, represented schematically by capacitors 64', which are coupled to the output transmission line 68.

SUMMARY OF THE INVENTION

The present invention is a power amplifier module with a single stage output impedance matching network that is improved by the addition of an intermediate set of bonding pads which allow the impedance matching network to be tuned to maximize output circuit performance. The intermediate bonding pads are coupled to the SSPA power transistor through short bond wires and are in close proximity to the transistor. They are also coupled to the output dielectric substrate through a set of longer tunable bond wires. The associated capacitance of the output dielectric substrate and the inductance of the tunable set of bond wires act as the output impedance matching network.

DETAILED DESCRIPTION OF THE INVENTION

Figure 1:
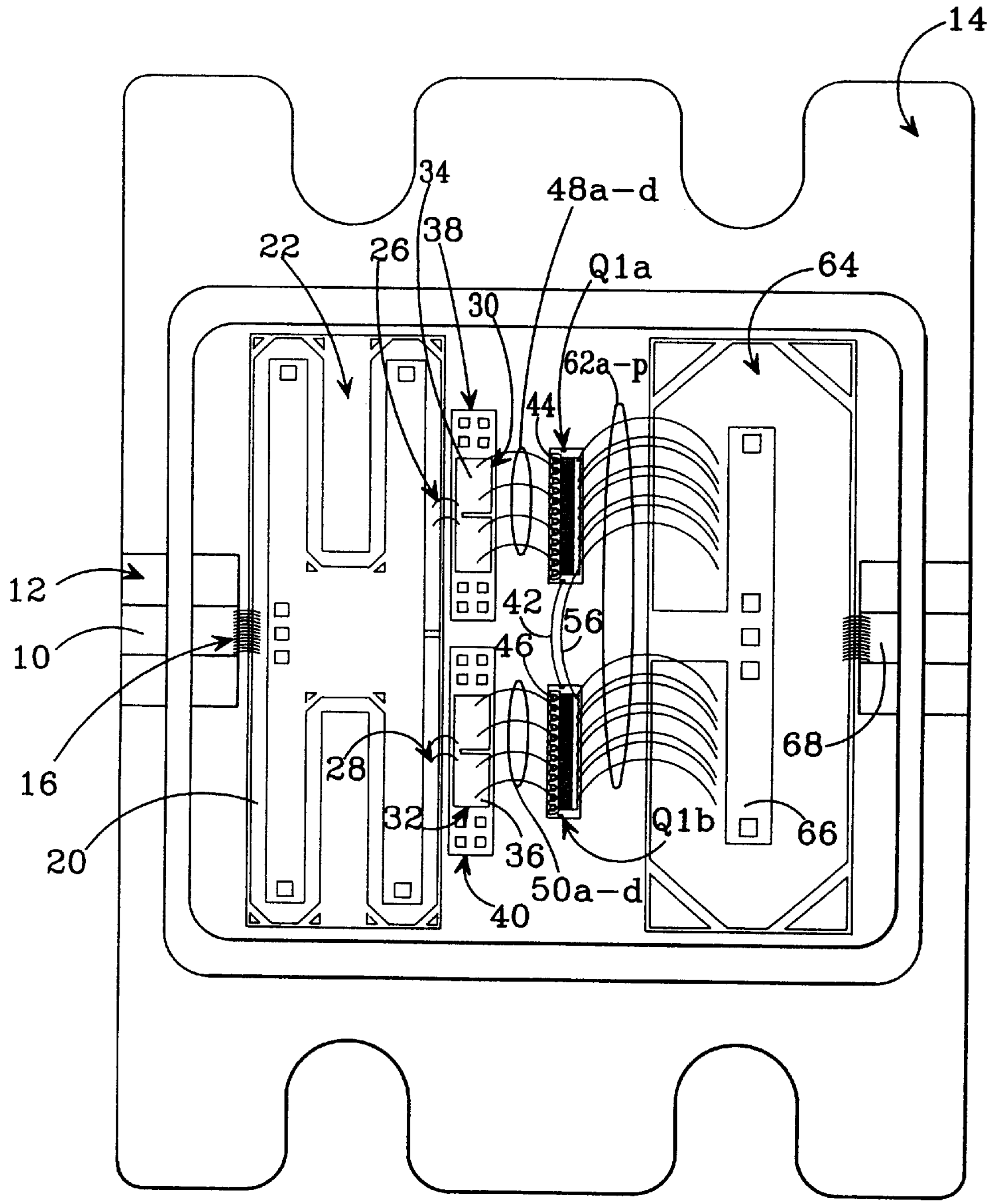
FIG. 1 is a plan view of a prior power amplifier module, described above.
Figure 5:
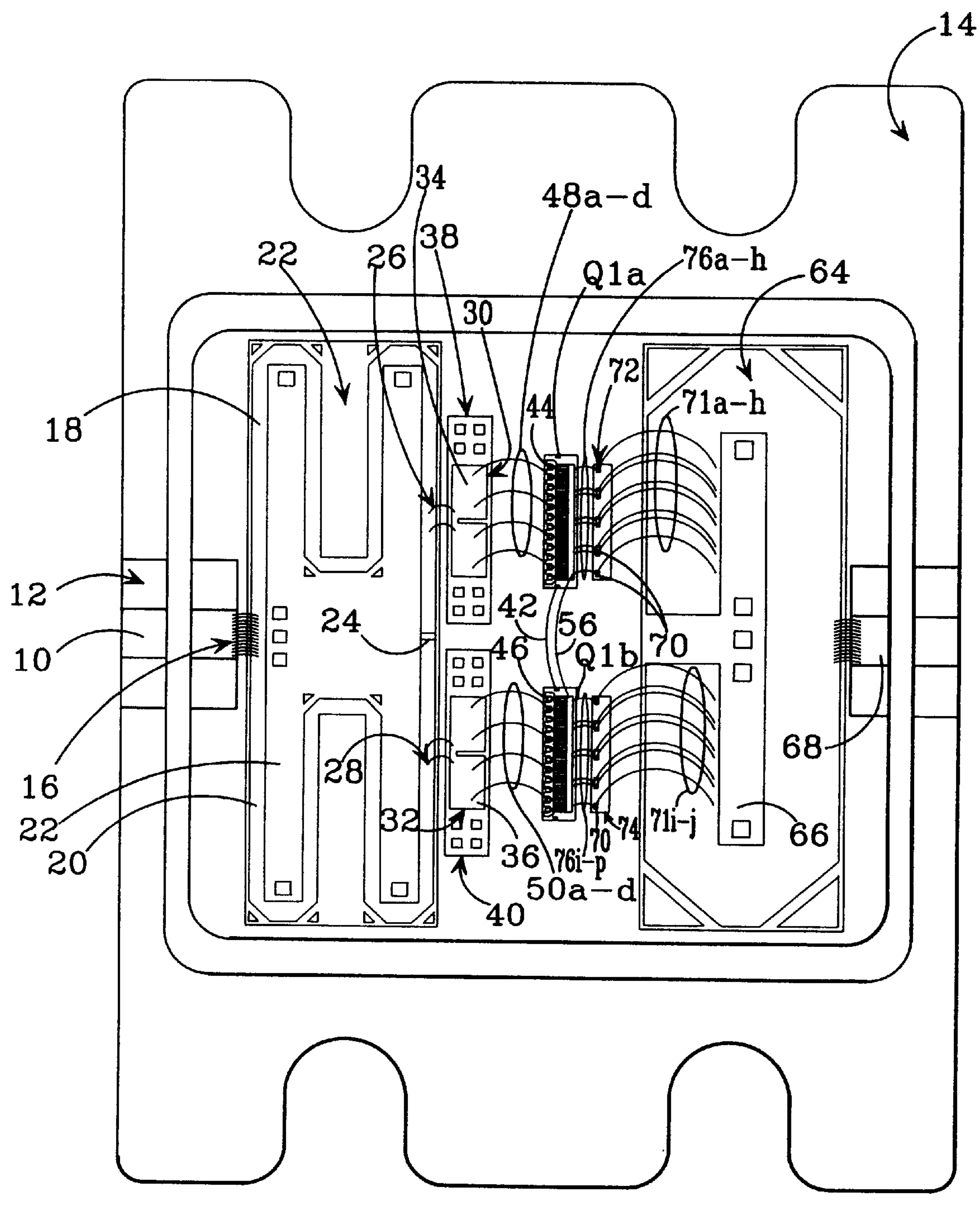
FIG. 5 is a plan view of a power amplifier module of the invention.

FIG. 5 shows a plan view of the power amplifier module of this invention. The circuit is essentially the same as the prior circuit of FIG. 1 except for the addition of an intermediate set of gold bonding pads 70 on associated alumina slave boards 72,74 between Q1 and the output power combiner bonding pad 64, the addition of gold bond wires 76*a–p* between the intermediate bonding pads 70 and the drain of Q1, and the movement of bond wires 62*a–p* from the Q1 drain to the intermediate bonding pads 70, where they are indicated by 71*a–p*. Slave boards 72,74 are soldered to the inside of copper package 14, preferably with gold tin or gold germanium solder.

Figure 6:
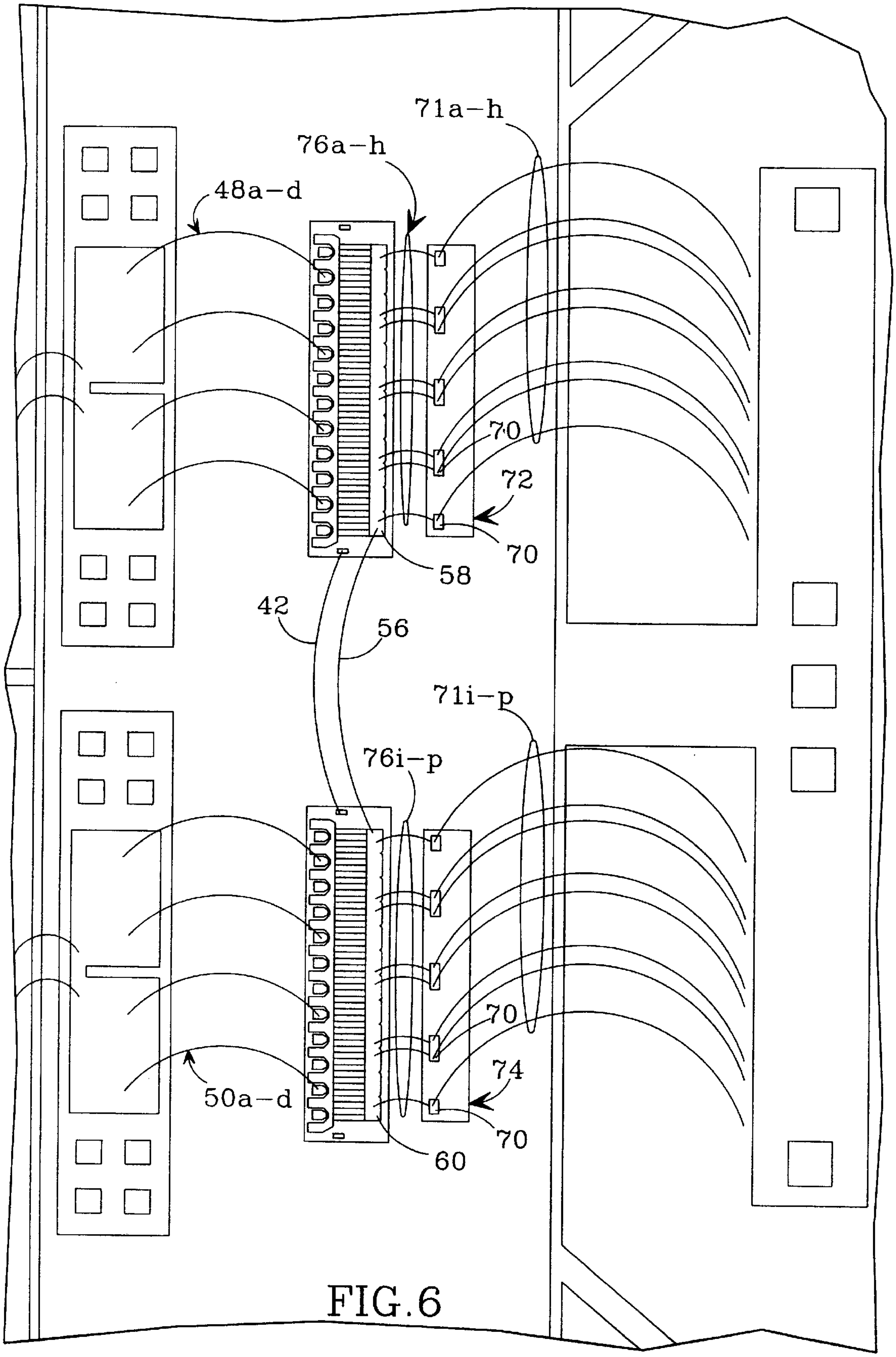
FIG. 6 is an enlarged fragmentary view of the output impedance matching network of FIG. 5.

FIG. 6 shows the new structure in more detail. The bond pads 70 exhibit better adhesion to the preferably alumina slave boards 72,74 than they do to GaAsFET Q1. This allows bond wires 71*a–p* to be attached with superior strength to the slave board 72,74, and thus allows a technician to move the bond wires 71*a–p* to adjust the inductance without fear that a bond wire will pull a portion of the bond pad off the slave board. If this does happen the dimensions of the intermediate bond pads are preferably about 0.25×0.37 mm (0.010×0.015 inches), which is large enough to allow for reattachment of bond wires several times, as opposed to bond pads on GaAsFET Q1 for which reattachment is not possible and the part would have to be scrapped.

The net effect is that the output impedance matching network 69 between Q1 and the output transmission line 68 has only one stage of inductive and capacitive impedance, and the bond wires 71*a–p* can be adjusted by a technician. Because only one stage is needed, the PAE is maintained at a high level and losses are reduced.

The slave boards are preferably positioned about 0.37 mm (0.015 inches) from Q1 to keep bond wires 76*a–p* short, about one-eighth the length of bond wires 71*a–p*. Hence, the inductance of bond wires 76*a–p* is low in comparison to that for bond wires 71*a–p*. The intermediate bond pads 70 are small to keep the capacitance low, preferably below about 0.07 picofarads. This means that both the inductance of bond wires 76*a–p* and the capacitance of the intermediate bond pads 70 on the slave boards are very small and have very little effect on the tuning of the output matching network.

Figure 2:
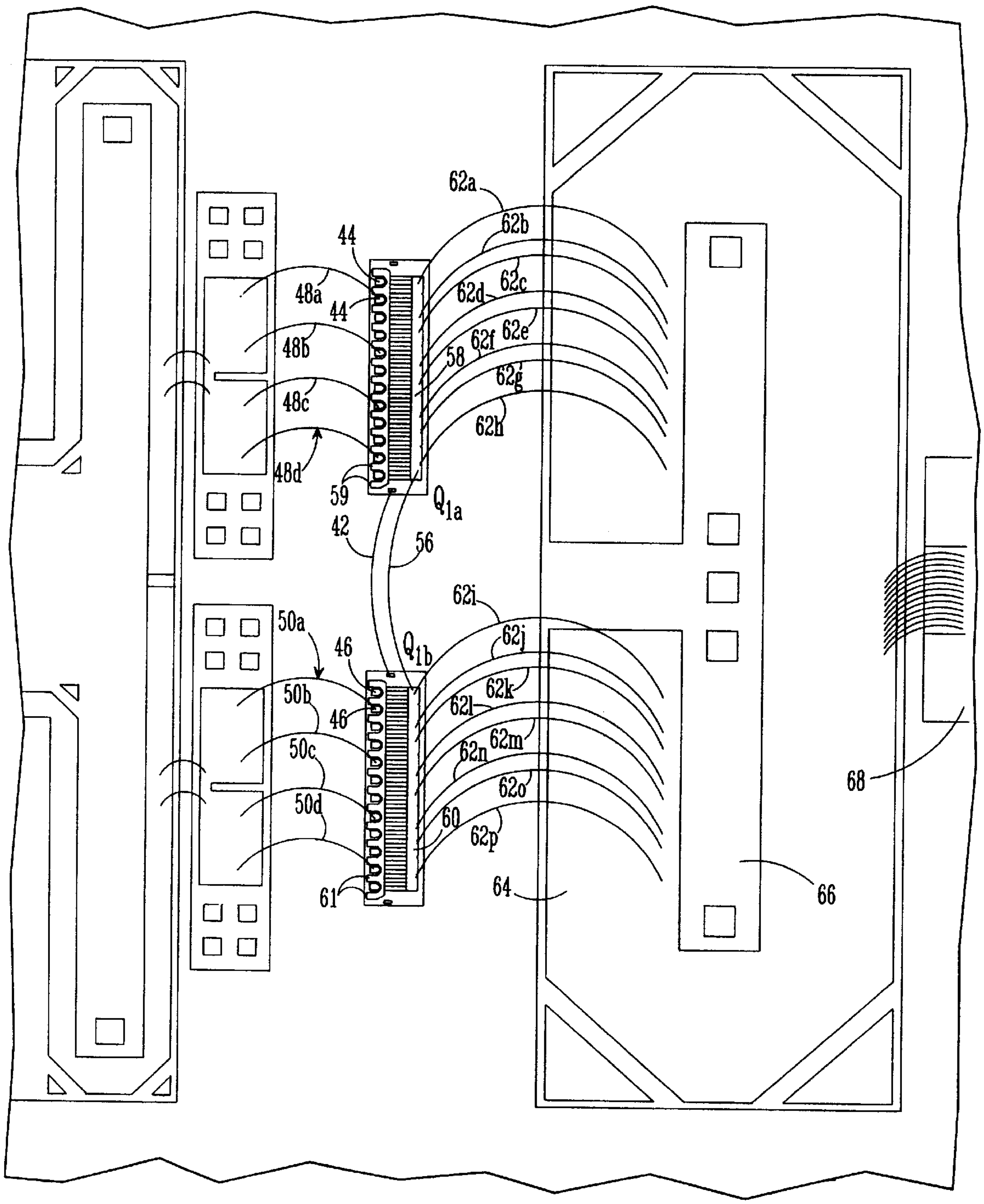
FIG. 2 is an enlarged fragmentary view of the two power FET sections in FIG. 1.
Figure 3:
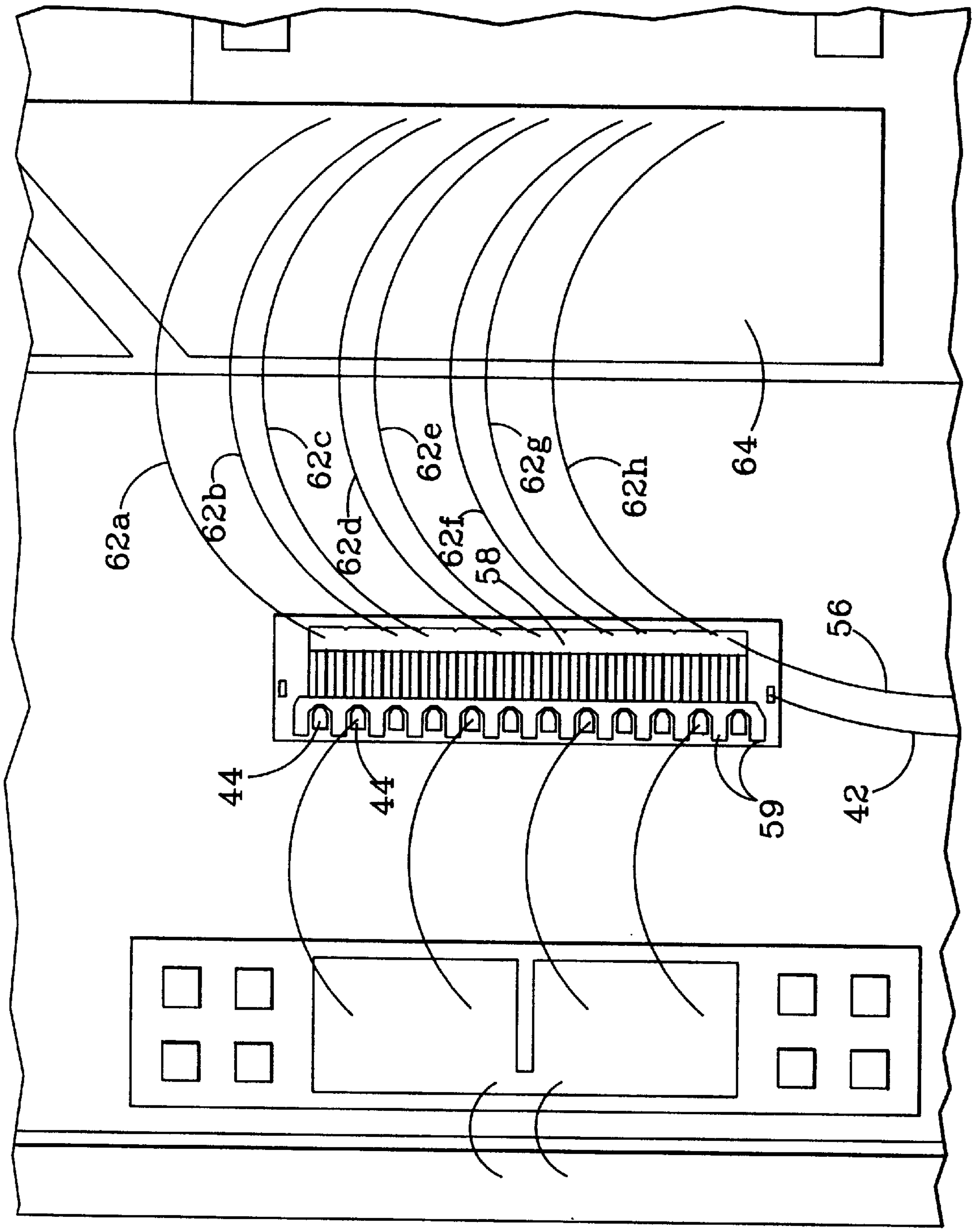
FIG. 3 is an enlarged fragmentary view of a portion FIG. 2.
Figure 4:
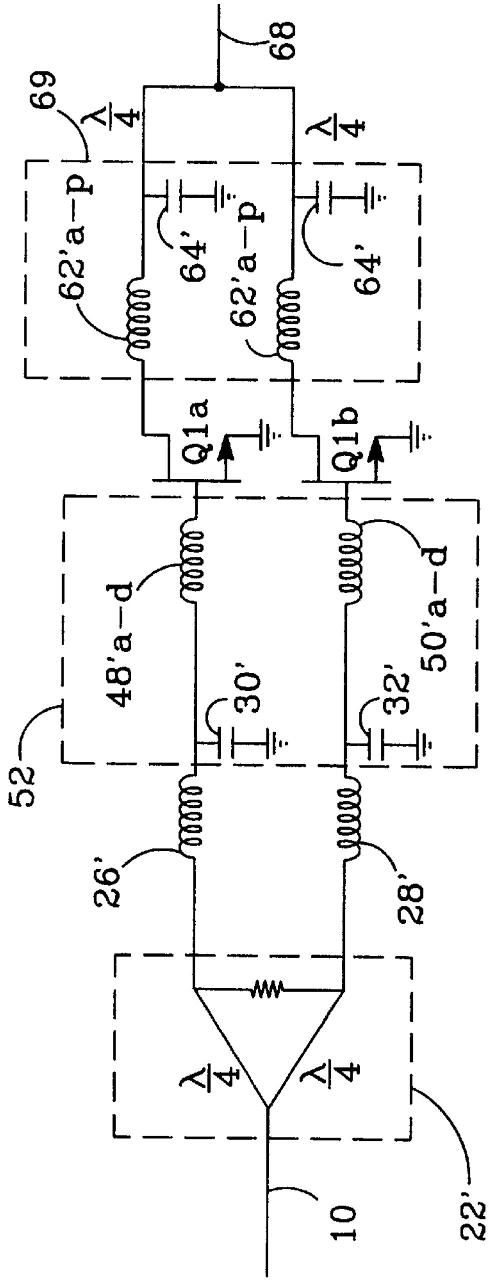
FIG. 4 is an electrical schematic of the power amplifier module of FIG. 1.
Figure 7:
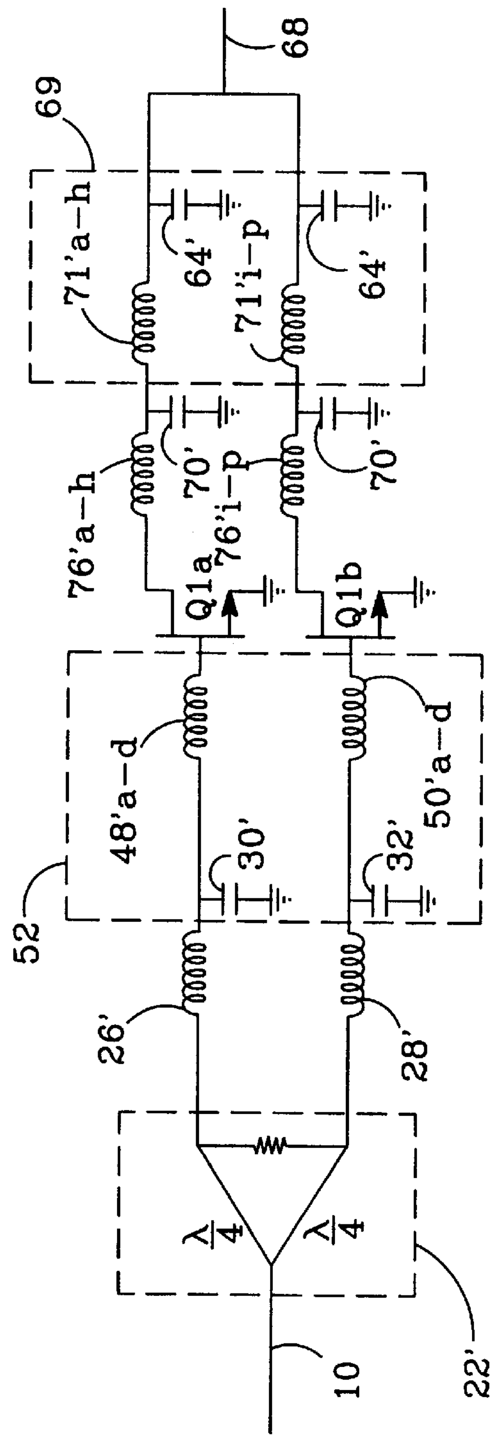
FIG. 7 is an electrical schematic of the power amplifier module of FIG. 5.

FIG. 7 is an electrical schematic of the power amplifier module shown in FIG. 5. It is the same as FIG. 2, except inductances 76'*a–p* from bond wires 76*a–p* and capacitances 70' from the intermediate bond pads 70 are added, and inductances 71'*a–p* associated with bond wires 71*a–p* are shown instead of inductances 62'*a–p*. The inductances of 76'*a–p* and capacitances 70' are small enough that they have little effect on the output impedance matching network 69 formed from capacitances 64' and inductances 71'*a–p*. The output impedance matching network 69 is thus a tunable one stage output matching network that allows high PAE by minimizing losses.

An experiment was performed on a power amplifier module Fujitsu LTD model FLM1415L-20 internally matched FET. The device was placed in an amplifier test fixture which allowed the application of DC bias voltages to the gate and drain terminals of the FET, and also provided coaxial RF connectors for the application of RF signals. The device was tested at 1.545 GHz at a bias condition of Vds=8.0 V, Ids=1.3 A (bias condition with no RF signal applied). The device achieved 14.4 dB linear gain and a PAE of 58.7% with an output power of 41.74 dBm. The original drain bond wires were removed, the intermediate bonding pads were added and the drain bond wires were reattached to the intermediate bonding pads. After adjusting the bond wires from the slave board to the output power combiner, a 14.3 DB linear gain and a peak PAE of 65.3% with 41.52 dBm output power at the same bias condition was achieved.

The improvement in PAE provides substantial cost savings to a satellite program. A figure of merit used in spacecraft design is that the weight of the power subsystem for the spacecraft is 1 lb. for 6–7 watts DC power. Current launch cost estimates are approximately $25,000–$30,000 per pound of spacecraft. Improving the PAE of the internally matched FET from 58.7% to 65.3%, as in the example, saves 2.27 watts DC power at the given RF output power. For the lower efficiency amplifier this additional 2.27 watts is converted to heat which the spacecraft must also contend with. For a spacecraft having 200 SSPAs this results in a savings of over 400 watts DC power, or equivalently over 50 lbs. of power subsystem and over $1 million in launch costs.

While the preferred embodiment of the invention has been shown and described, numerous variations and alternative embodiments will occur to those skilled in the art. Accordingly, it is intended that the invention be limited only in terms of the appended claims.

We claim:

1. A method of enhancing an impedance match between integrated-circuit transistors and transmission lines, comprising the steps of:

coupling a microstrip power-guidance structure to one of said transmission lines;

positioning a dielectric substrate and its bonding pads proximate to a selected one of said transistors;

connecting said selected transistor to said bonding pads with bonding wires;

installing a plurality of inductive leads between said bonding pads and said microstrip power-guidance structure; and altering at least one of the length, shape and lead proximity of at least one of said inductive leads to enhance said impedance match.

2. The method of claim 1, wherein said altering step includes the step of reattaching to their respective bonding pads, any of said inductive leads that have detached during said altering step.

3. The method of claim 1, wherein said positioning step includes the step of causing said bonding pads to have an area sufficient to facilitate reattachment of any of said inductive leads that have detached during said altering step.

4. The method of claim 3, wherein said area is on the order of 0.25×0.37 millimeters.

5. The method of claim 1, wherein said positioning step includes the step of locating said dielectric substrate so that said bonding wires have substantially one-eighth the length of said inductive leads.

6. The method of claim 1, wherein said positioning step includes the step of placing said dielectric substrate within 0.37 millimeters of said selected transistor.

7. The method of claim 1, wherein said power-guidance structure is a power combiner.

8. The method of claim 1, wherein said dielectric substrate is an alumina substrate.

* * * * *